(12) United States Patent
Cave et al.

(10) Patent No.: US 6,313,024 B1
(45) Date of Patent: Nov. 6, 2001

(54) METHOD FOR FORMING A SEMICONDUCTOR DEVICE

(75) Inventors: Nigel G. Cave; Kathleen C. Yu; Janos Farkas, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/394,190

(22) Filed: Sep. 10, 1999

Related U.S. Application Data (63) Continuation of application No. 09/191,353, filed on Nov. 13, 1998.

(51) Int. Cl.$^7$ .................... H01L 21/44; H01L 24/2763
(52) U.S. Cl. .................... 438/598; 438/612; 438/613; 438/617; 438/622; 438/623; 438/633; 438/637; 438/645; 438/648; 438/687; 438/688
(58) Field of Search .................... 438/598, 612, 438/613, 617, 618, 622, 623, 624, 631, 633, 637, 645, 648, 687, 688

(56) References Cited

U.S. PATENT DOCUMENTS

| | | | |
|---|---|---|---|
| 4,729,063 | 3/1988 | Matsuo et al. | 361/414 |
| 4,984,061 | 1/1991 | Matsumoto | 357/68 |
| 5,036,383 | 7/1991 | Mori | 357/71 |
| 5,220,199 | 6/1993 | Owada et al. | 257/773 |
| 5,270,256 | 12/1993 | Bost et al. | 437/195 |
| 5,287,002 | 2/1994 | Freeman, Jr. et al. | 257/781 |
| 5,394,013 | 2/1995 | Oku et al. | 257/786 |
| 5,478,781 * | 12/1995 | Bertin et al. | 438/109 |
| 5,485,038 | 1/1996 | Licari et al. | 257/758 |
| 5,621,246 | 4/1997 | Motoyama | 257/736 |
| 5,728,628 * | 3/1998 | Havemann | 438/668 |
| 5,773,899 | 6/1998 | Zambrano | 257/784 |
| 5,976,710 * | 11/1999 | Sachdex et al. | 428/620 |

OTHER PUBLICATIONS

Saran et al, "Elimination of Bond–pad Damage through Structural Reinforcement of Intermetal Dielectrics," 36th Annual International Reliability Physics Symposium, IEEE 98CH36173, pp. 225–231 (1998).

* cited by examiner

*Primary Examiner*—Carl Whitehead, Jr.
*Assistant Examiner*—Paula Perkins
(74) *Attorney, Agent, or Firm*—Robert A. Rodriguez; Kent J. Cooper (57) ABSTRACT

In one embodiment of the invention, conductive support structures (112) are formed within an interlevel dielectric layer. The conductive support structures (112) lie within the bond pad region (111) of the integrated circuit and provide support to portions of the interlevel dielectric layer that have a low Young's modulus. The conductive support structures (112) are formed using the same processes that are used to form metal interconnects in the device region (109) of the integrated circuit, but they are not electrically coupled to semiconductor devices that lie within the device region (109). Conductive support structures (114) are also formed within the scribe line region (104) to provide support to the interlevel dielectric layer in this region of the integrated circuit.

20 Claims, 7 Drawing Sheets

METHOD FOR FORMING A SEMICONDUCTOR DEVICE

This application is a divisional of Ser. No. 09/191,353 filed Nov. 13, 1998.

FIELD OF THE INVENTION

This invention relates generally to integrated circuits, and more specifically to a conductive support structure within an integrated circuit and its method of formation.

BACKGROUND OF THE INVENTION

Semiconductor devices are continuing to be scaled to smaller dimensions. This is producing an increase in the overall density and number of interconnects being fabricated on the semiconductor device which in turn is creating new integration problems with respect to interconnect resistance-capacitance (RC) coupling.

Decreasing the dimensions of the interconnects increases their resistance (R), and reducing the spacing between interconnects increases the capacitance (C) between them. Propagation delay, crosstalk noise, and power dissipation of the device circuitry due to RC coupling become significant at smaller device geometries, especially between interconnect lines on the same level. In an effort to overcome the problems associated with increasing capacitance, low dielectric constant (low-k) materials have been proposed as a replacement for conventional interlevel dielectric (ILD) films commonly used in semiconductor device fabrication.

Current methods for planarizing low-k dielectric materials, however, are problematic. Specifically when using chemical-mechanical polishing (CMP) processes. The structure of many low-k dielectric materials is such that they have been found to be mechanically weak or compressible. The horizontal and vertical stresses applied during CMP processing are such that low-k dielectric materials are often deformed or damaged by the polishing process. One consequence of this damage is the generation of particles and defects that adversely affect device yields. Accordingly, a need exists to develop alternatives that overcome the aforementioned problems when planarizing low-k dielectric materials.

BRIEF DESCRIPTION OF THE DRAWINGS

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
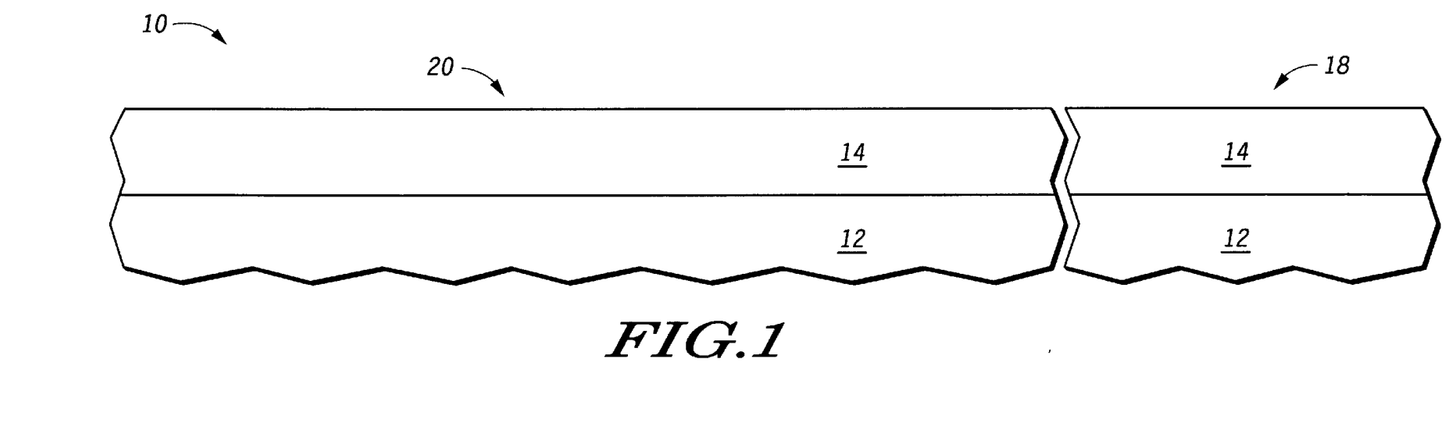
FIGS. 1–7 illustrate, in cross-section, process steps in accordance with one embodiment of the present invention.

Shown in FIG. 1 is a portion 10 of an integrated circuit structure in accordance with one embodiment of the present invention. The integrated circuit structure comprises a semiconductor substrate 12 having a bond pad region 20 (periphery) and a scribe line region 18, and a dielectric layer 14.

In one embodiment, semiconductor substrate 12 is a monocrystalline silicon substrate. Alternatively, semiconductor substrate 12 may be a silicon-on-insulator substrate, a silicon-on-sapphire substrate, or the like. Dielectric layer 14 is formed using a material having a high modulus of elasticity (Young's modulus). The modulus of elasticity of a material is an indicator of its rigidity or stiffness. For the purposes of this specification, a material having a high modulus of elasticity is any material having a modulus of elasticity greater than approximately 15.00 Giga Pascals (GPa). In one embodiment, dielectric layer 14 is a layer of plasma deposited oxide which is formed using tetraethoxysilane (TEOS) as a source gas and has a modulus of elasticity greater than approximately 50 GPa. Alternatively, dielectric layer 14 may be a layer of silicon nitride, a layer of phosphosilicate glass (PSG), a layer of borophosphosilicate glass (BPSG), a silicon oxynitride layer, a thermal oxide layer, or a combination thereof.

Figure 2:
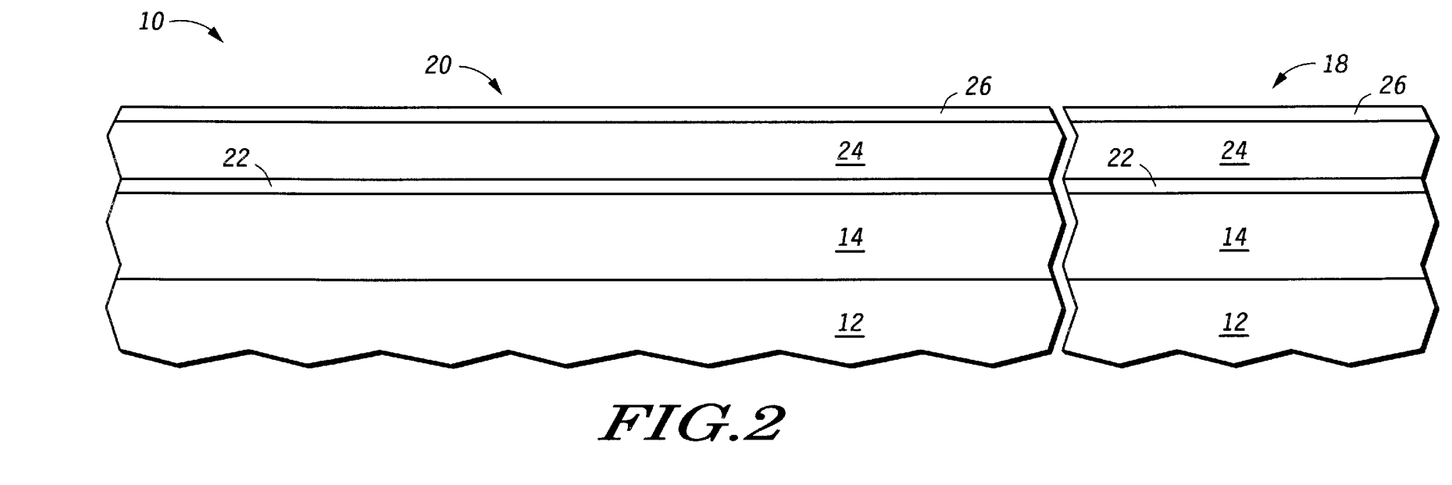

In FIG. 2 an etch stop layer 22 is formed overlying dielectric layer 14 and then a dielectric layer 24 is formed overlying etch stop layer 22. A polish stop layer 26 is then formed overlying dielectric layer 24.

In one embodiment, etch stop layer 22 is a layer of silicon oxynitride which is formed using conventional plasma deposition techniques. Alternatively, etch stop layer 22 may be a layer of plasma deposited silicon nitride, a boron nitride layer, a silicon oxide, or the like.

Dielectric layer 24 is formed using a material having a low modulus of elasticity (Young's modulus), and in one embodiment dielectric layer 24 is a low dielectric constant (low-k) material. For the purposes of this specification, a low modulus of elasticity material is a material having a Young's modulus measuring less than approximately 15 GPa and a low-k material is a material having a dielectric constant below approximately 3.6. In one embodiment, dielectric layer 24 is a layer of porous oxide, such as xerogel, having a Young's modulus ranging from approximately 0.2 to 0.1 GPa and a dielectric constant of approximately 1.8. Alternatively, dielectric layer 24 may be formed using other dielectric materials including, aerogel, polyimide, parylene, biscyclobutenes, fluorocarbons, such as Teflon, polyarylether-based materials, spin on glass, polysiloxanes, silsesquioxanes, carbon-containing silicon oxide, or the like. In addition, a combination of the foregoing materials may also be used to form the dielectric layer 24. Dielectric materials having a modulus of elasticity of less than 15.0 are mechanically weak or compressible, as compared to silicon dioxide, which has a Young's modulus measuring approximately 80 GPa. As a result, the horizontal and vertical stresses applied during subsequent processing, specifically during chemical mechanical polishing, are such that low modulus of elasticity dielectric materials are susceptible to deformation or damage.

In one embodiment, polish stop layer 26 is a layer of silicon oxynitride. Alternatively, polish stop layer 26 may be a layer of plasma deposited silicon nitride, a boron nitride layer, or the like.

Figure 3:
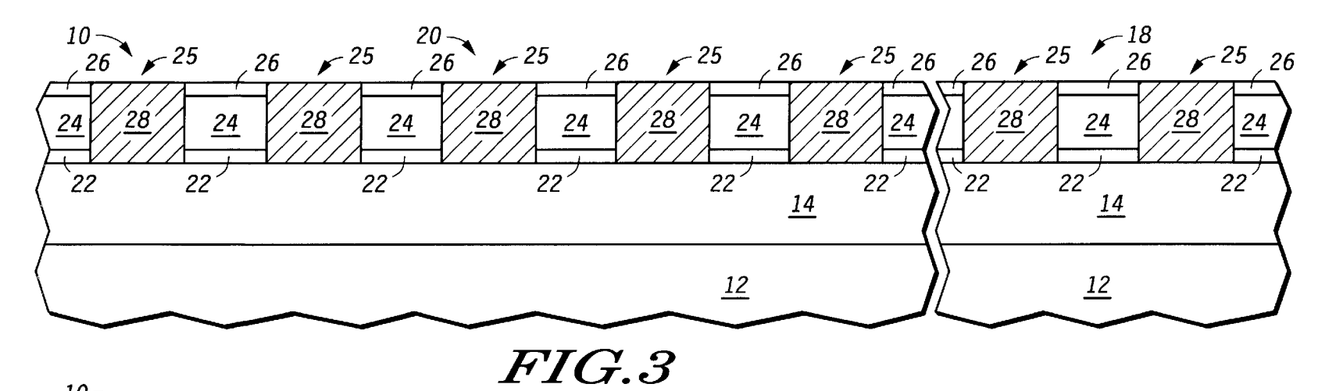

In FIG. 3, a portion of polish stop layer 26, a portion of dielectric layer 24 and a portion of etch stop layer 22 are removed to form openings 25. A conductive member 28 is then formed within each opening 25.

In one embodiment, conductive member 28 comprises tantalum nitride and copper and is formed by depositing a layer of tantalum nitride within opening 25 and then forming a layer of copper overlying the tantalum nitride layer. Chemical mechanical polishing is then used to remove portions of the copper layer and the tantalum nitride layer thereby forming conductive member 28, wherein conductive member 28 comprises a remaining portion of the tantalum nitride layer and a remaining portion of the copper layer.

In this particular embodiment, the tantalum nitride layer is deposited using conventional sputtering techniques. The copper layer is formed by first sputter depositing a thin layer of copper onto the tantalum nitride layer using conventional sputtering techniques, and then electroplating a thick copper layer onto the sputtered copper layer. In this particular embodiment, the electroplated copper layer may be deposited using a plating solution comprising copper (Cu), copper sulfate ($Cu_2SO_4$), sulfuric acid ($H_2SO_4$), and chloride ions, such as those from hydrochloric acid (HCI). In addition, in this particular embodiment, the electric current density is modified near the edges of the semiconductor substrate during the copper electroplating process in order to improve the copper electroplating uniformity, as is described in U.S. patent application Ser. No. 08/856,459, which is assigned to the assignee of the present application. The subject matter of U.S. patent application Ser. No. 08/856,459 is expressly incorporated herein by reference.

Portions of the copper layer and the tantalum nitride layer can then be removed with a chemical mechanical polishing process that uses a polishing slurry comprising hydrogen peroxide, ammonium citrate, alumina, 1,2,4-triazole, and deionized water, as is described in U.S. patent application Ser. No. 08/954,190, which is assigned to the assignee of the present application. The subject matter of U.S. patent application Ser. No. 08/954,190 is expressly incorporated herein by reference.

Alternatively, conductive members 28 may be formed using other conductive materials, such as titanium, tungsten, aluminum, titanium nitride, tungsten nitride, titanium-tungsten (TiW), tantalum silicon nitride, tantalum, or the like. In addition, conductive members 28 may also be formed using other electroplating techniques, other electroplating solutions, polishing techniques, polishing slurries, or other deposition techniques, such as chemical vapor deposition or electroless deposition.

It should be appreciated that conductive members 28 are formed at the same time that a given level of conductive interconnect is formed within the device region of the integrated circuit, however, they are not electrically connected to devices or functional circuit elements that lie within the device region or testable circuit elements (test structures) in the scribe line region. For example, in one embodiment, conductive members 28 are formed at the same time that the first level of conductive interconnect is formed in the device region. Thus, the formation of conductive members 28 does not require additional processing steps, such as a masking step or an etching step. More importantly, conductive members 28 provide support for the surrounding portions of dielectric layer 24 that lie within bonding pad region 20 and scribe line region 18, during subsequent processing. For example, conductive members 28 provide support for the surrounding portions of dielectric layer 24 during subsequent chemical mechanical polishing processes, as will now be discussed.

Because dielectric layer 24 is formed using a material that has a low modulus of elasticity, areas of dielectric layer 24 where interconnects are not usually formed, such as the bond pad region (20) and scribe line region (18), can easily be compressed or deformed by subsequent chemical mechanical polishing processes that exert compressive and shear forces on them. Placing conductive members 28 in these areas, however, provides stability and support to dielectric layer 24, improving its ability to withstand these forces, thereby preventing it from becoming damaged. For example, when a chemical mechanical polishing process is used to subsequently form an additional level of interconnect within the device region, conductive members 28 provide support to portions of dielectric layer 24 that lie within bond pad region 20 and scribe line region 18. More specifically, they minimize compression and deformation of dielectric layer 24, within bond pad region 20 and scribe line region 18, produced by the polishing process.

Figure 4:
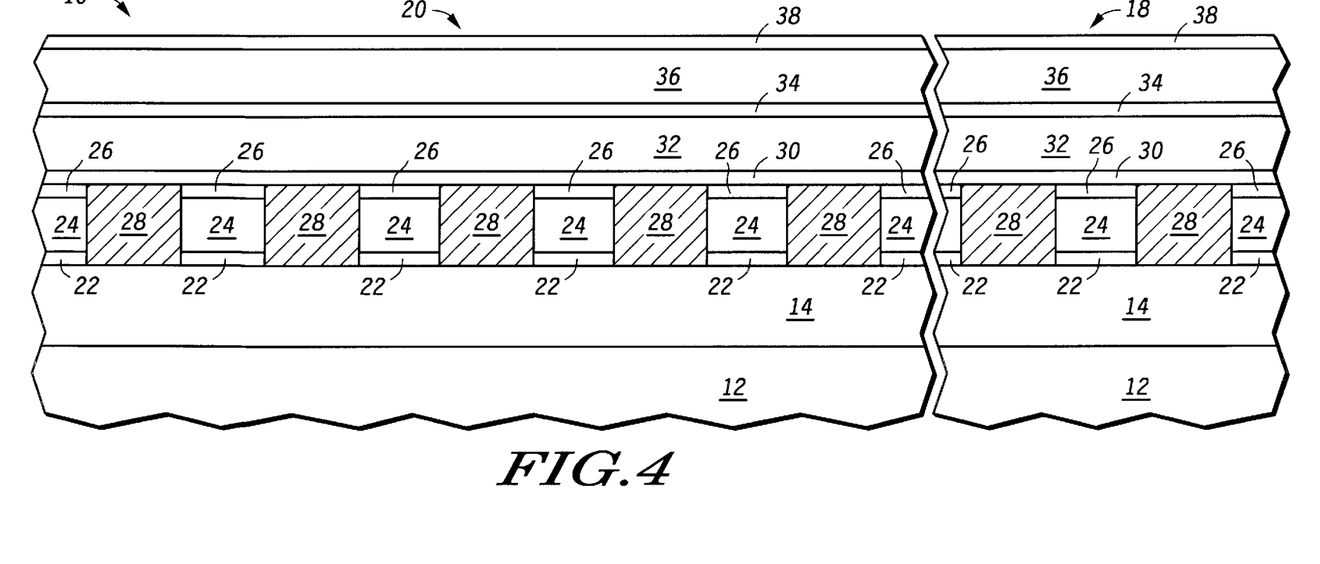

In FIG. 4, a passivation layer 30 is formed overlying conductive members 28. A dielectric layer 32 is then formed overlying passivation layer 30. An etch stop layer 34 is then formed overlying the dielectric layer 32. A dielectric layer 36 is formed overlying etch stop layer 34 and a polish stop layer 38 is formed overlying dielectric layer 36.

In one embodiment, passivation layer 30 is a layer of silicon oxynitride which is formed using conventional plasma deposition techniques. Alternatively, passivation layer 30 may be a layer of plasma deposited silicon nitride, a boron nitride layer, a silicon dioxide layer formed using TEOS as a source gas, or the like. Dielectric layer 32 is formed using a material having a low modulus of elasticity (Young's modulus), and in one embodiment dielectric layer 32 is a low dielectric constant (low-k) material. In one embodiment, dielectric layer 32 is a layer of porous oxide, such as xerogel, having a Young's modulus ranging from approximately 0.2 to 0.1 GPa and a dielectric constant of approximately 1.8. Alternatively, dielectric layer 32 may be formed using other dielectric materials including, aerogel, polyimide, parylene, biscyclobutenes, fluorocarbons, such as Teflon, polyarylether-based materials, spin on glass, polysiloxanes, silsesquioxanes, carbon-containing silicon oxide, or the like. In addition, a combination of the foregoing materials may also be used to form the dielectric layer 32.

In one embodiment, etch stop layer 34 is a layer of silicon oxynitride. Alternatively, etch stop layer 34 may be a layer of plasma deposited silicon nitride, a boron nitride layer, or the like. Dielectric layer 36 is formed using a material having a low modulus of elasticity (Young's modulus), and in one embodiment dielectric layer 36 is a low dielectric constant (low-k) material. In one embodiment, dielectric layer 36 is a layer of porous oxide, such as xerogel, having a Young's modulus ranging from approximately 0.2 to 0.1 GPa and a dielectric constant of approximately 1.8. Alternatively, dielectric layer 36 may be formed using other dielectric materials including, aerogel, polyimide, parylene, biscyclobutenes, fluorocarbons, such as Teflon, polyarylether-based materials, spin on glass, polysiloxanes, silsesquioxanes, carbon-containing silicon oxide, or the like. In addition, a combination of the foregoing materials may also be used to form the dielectric layer 36. In one embodiment, polish stop layer 38 is a layer of silicon oxynitride. Alternatively, polish stop layer 38 may be a layer of plasma deposited silicon nitride, a boron nitride layer, or the like.

Figure 5:
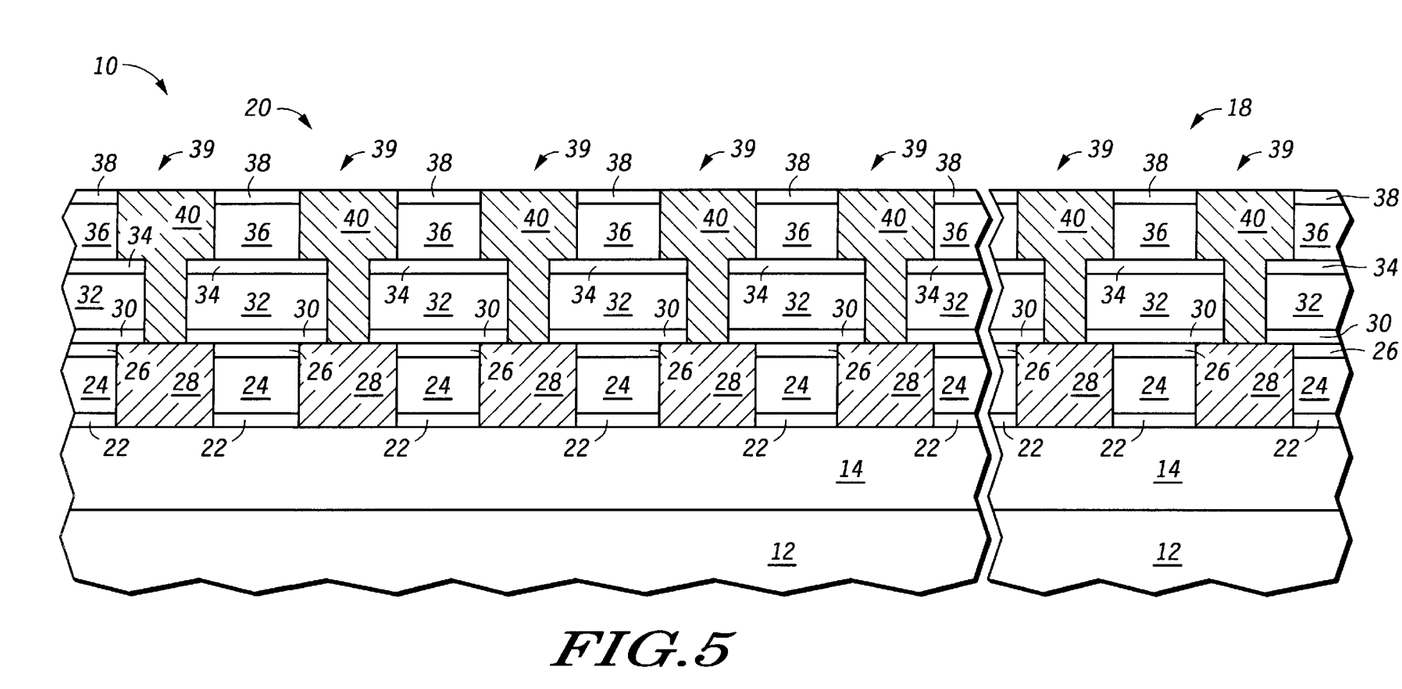

In FIG. 5, a portion of the polish stop layer 38, a portion of the dielectric layer 36, a portion of the etch stop layer 34, a portion of the dielectric layer 32 and a portion of the passivation layer 30 are removed to form openings 39. A conductive member 40 is then formed within each opening 39, as previously described in FIG. 3. Each conductive member 40 contacts an underlying conductive member 28 and is electrically shorted to the underlying conductive member 28.

It should be appreciated that conductive members 40 are formed at the same time that a given level of conductive interconnect is formed within the device region of the integrated circuit, however, they are not electrically connected to devices or functional circuit elements that lie within the device region or testable circuit elements (test structures) in the scribe line region. For example, in one embodiment, conductive members 40 are formed at the same time that the second level of conductive interconnect is formed within the device region. Thus, the formation of conductive members 40 does not require any additional processing steps, such as a masking step or an etching step. More importantly, conductive members 40 provide support for the surrounding portions of dielectric layer 32 and dielectric layer 36 within bonding pad region 20 and scribe line region 18, during subsequent processing. For example, during a subsequent chemical mechanical polishing processing step, as will now be discussed.

Because dielectric layer 32 and dielectric layer 36 are formed using a material that has a low modulus of elasticity, areas of dielectric layers 32 and 36 where interconnects are not usually formed, such as the bond pad region (20) and scribe line region (18), can easily be compressed or deformed by subsequent chemical mechanical polishing processes that exert compressive and shear forces on them. Placing conductive members 40 in these areas, however, provides stability and support to dielectric layer 32 and dielectric layer 36, improving their ability to withstand these forces, thereby preventing them from becoming damaged. For example, when a chemical mechanical polishing process is used to form an additional level of interconnect within the device region, conductive members 40 support and stabilize portions of dielectric layer 32 and dielectric layer 36 that lie within bond pad region 20 and scribe line region 18. More specifically, they minimize compression and deformation of dielectric layer 32 and dielectric layer 36 within bond pad region 20 and scribe line 18 produced by the polishing process.

Figure 6:
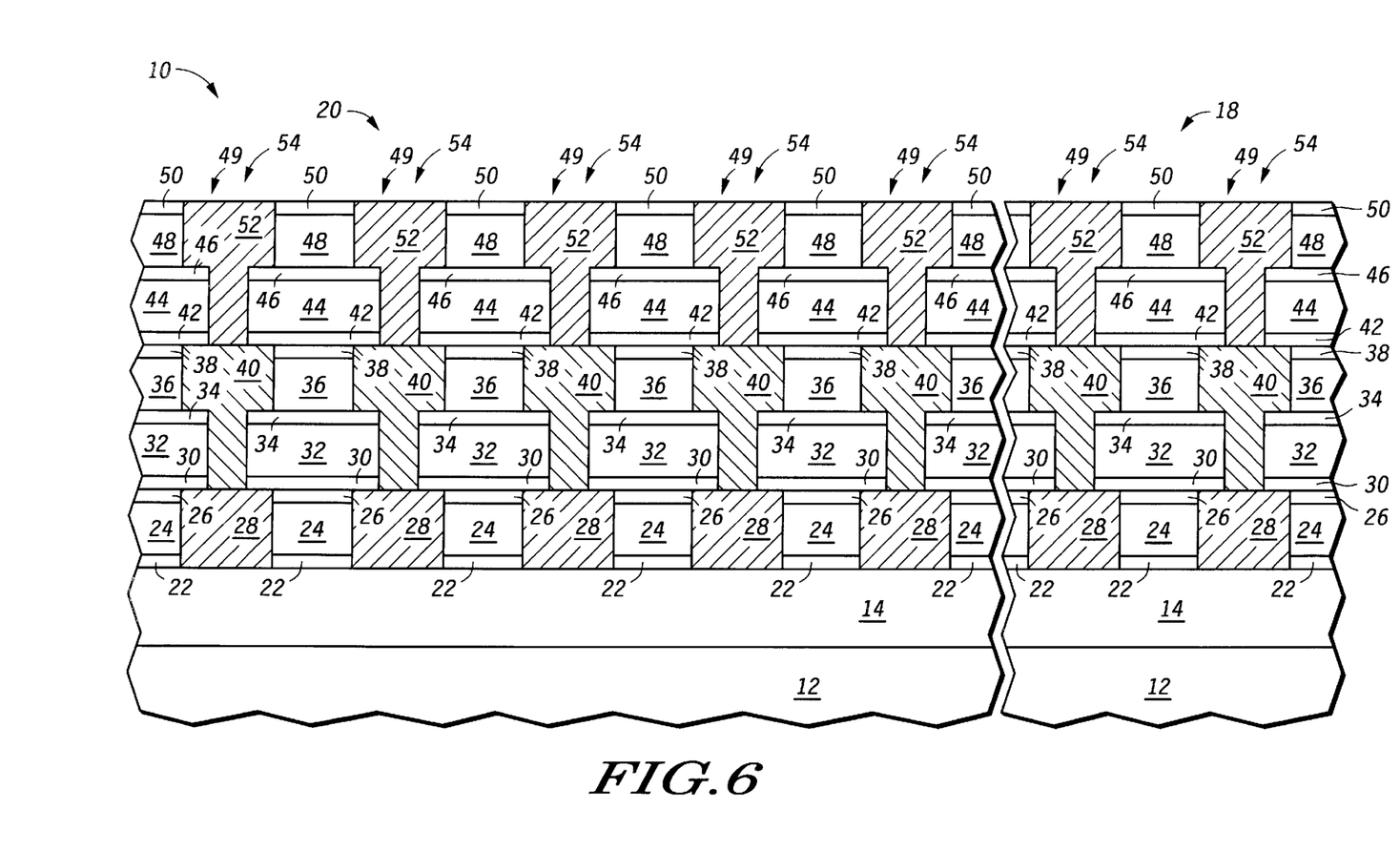

In FIG. 6, a passivation layer 42 is formed overlying conductive members 40. A dielectric layer 44 is then formed overlying passivation layer 42. An etch stop layer 46 is then formed overlying the dielectric layer 44. A dielectric layer 48 is formed overlying etch stop layer 46 and a polish stop layer 50 is formed overlying dielectric layer 48.

In one embodiment, passivation layer 42 is a layer of silicon oxynitride which is formed using conventional plasma deposition techniques. Alternatively, passivation layer 42 may be a layer of plasma deposited silicon nitride, a boron nitride layer, or the like. Dielectric layer 44 is formed using a material having a low modulus of elasticity (Young's modulus), and in one embodiment dielectric layer 44 is a low dielectric constant (low-k) material. In one embodiment, dielectric layer 44 is a layer of porous oxide, such as xerogel, having a Young's modulus ranging from approximately 0.2 to 0.1 GPa and a dielectric constant of approximately 1.8. Alternatively, dielectric layer 44 may be formed using other dielectric materials including, aerogel, polyimide, parylene, biscyclobutenes, fluorocarbons, such as Teflon, polyarylether-based materials, spin on glass, polysiloxanes, silsesquioxanes, carbon-containing silicon oxide, or the like. In addition, a combination of the foregoing materials may also be used to form- the dielectric layer 44. In one embodiment, etch stop layer 46 is a layer of silicon oxynitride. Alternatively, etch stop layer 46 may be a layer of plasma deposited silicon nitride, a boron nitride layer, or the like.

Dielectric layer 48 is formed using a material having a low modulus of elasticity (Young's modulus), and in one embodiment dielectric layer 48 is a low dielectric constant (low-k) material. In one embodiment, dielectric layer 48 is a layer of porous oxide, such as xerogel, having a Young's modulus ranging from approximately 0.2 to 0.1 GPa and a dielectric constant of approximately 1.8. Alternatively, dielectric layer 48 may be formed using other dielectric materials including, aerogel, polyimide, parylene, biscyclobutenes, fluorocarbons, such as Teflon, polyarylether-based materials, spin on glass, polysiloxanes, silsesquioxanes, carbon-containing silicon oxide, or the like. In addition, a combination of the foregoing materials may also be used to form the dielectric layer 48. In one embodiment, polish stop layer 50 is a layer of silicon oxynitride. Alternatively, polish stop layer 50 may be a layer of plasma deposited silicon nitride, a boron nitride layer, or the like.

A portion of the polish stop layer 50, a portion of the dielectric layer 48, a portion of the etch stop layer 46, a portion of the dielectric layer 44 and a portion of the passivation layer 42 are removed to form openings 49. A conductive member 52 is then formed within each opening 49, as previously described in FIG. 5 to form conductive member 40 within each opening 39. The combination of conductive member 52, conductive member 40, and conductive member 28 form a conductive support structure 54. As shown in FIG. 6, conductive members 52 contact and are electrically shorted to the underlying conductive members 40.

It should be appreciated that conductive members 52 are formed at the same time that a given level of conductive interconnect is formed within the device region of the integrated circuit, however, they are not electrically connected to devices or functional circuit elements that lie within the device region or testable circuit elements (test structures) in the scribe line region. For example, in one embodiment, conductive members 52 are formed at the same time that the third level of conductive interconnect is formed within the device region. Thus, the formation of conductive members 52 does not require additional processing steps, such as an additional masking step or etching step. More importantly, conductive members 52 provide support for the surrounding portions of dielectric layer 44 and dielectric layer 48 within bonding pad region 20 and scribe line region 18, during subsequent processing as discussed previously with conductive members 40.

Moreover, conductive support structures 54 provide support to regions of the low-k dielectric layers that have a relatively low density of interconnect features, such as the bond pad region (20) and the scribe line region (18). For example, in FIG. 6 each conductive support structure 54 extends through dielectric layer 48, dielectric layer 44, dielectric layer 36, dielectric layer 32, and dielectric layer 24 and thus each of them provides support for these dielectric layers.

Figure 7:
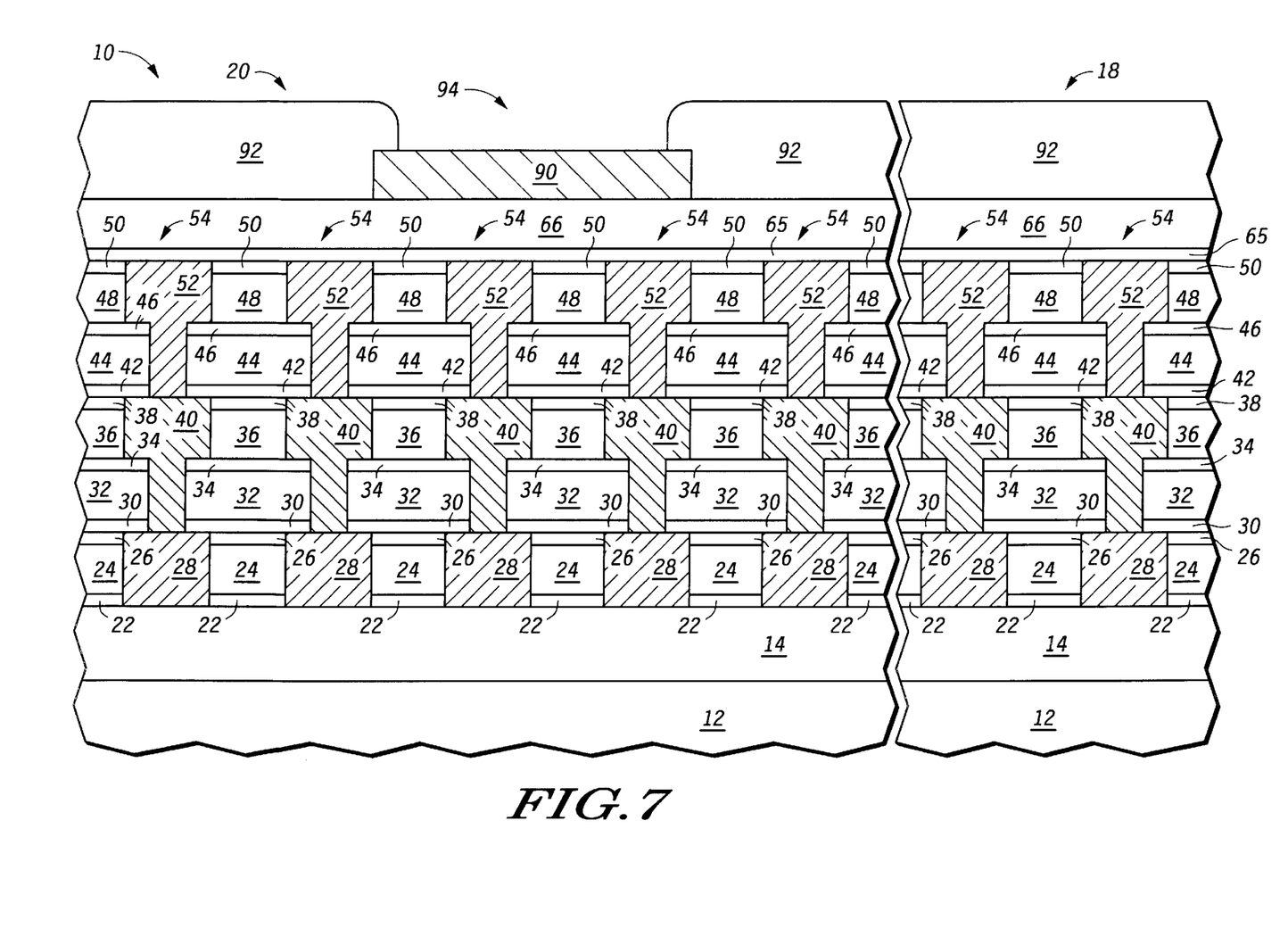

In FIG. 7, a passivation layer 65 is then formed overlying conductive support structures 54, and a dielectric layer 66 is formed overlying passivation layer 65. In one embodiment, passivation layer 65 is a layer of silicon oxynitride which is formed using conventional plasma deposition techniques. Alternatively, passivation layer 65 may be a layer of plasma deposited silicon nitride, a boron nitride layer, or the like. In one embodiment, dielectric layer 66 is a layer of plasma deposited oxide which is formed using TEOS as a source gas. Alternatively, dielectric layer 66 may be a layer of silicon nitride, a layer of PSG, a layer of BPSG, a silicon oxynitride layer, a fluorinated oxide, an SOG material, or a combination thereof. A conductive bonding pad 90 is then formed overlying dielectric layer 66. Conductive bonding pad 90 is electrically connected to semiconductor devices (not shown) that lie within the device region of the integrated circuit. In one embodiment, conductive bonding pad 90 is formed by depositing a conductive layer comprising aluminum, such as aluminum, aluminum-silicon, aluminum-copper, aluminum-silicon-copper, or the like, and then patterning and etching the conductive layer using conventional techniques. Alternatively, conductive bond pad 90 may be formed using other conductive materials, such as copper, tungsten, titanium, or the like. A passivation layer 92 is formed overlying dielectric layer 66 and conductive bonding pad 90. The passivation layer 92 is then patterned and etched to define a bond pad opening 94. In one embodiment, passivation layer 92 is a layer of plasma deposited silicon nitride. Alternatively, passivation layer 92 may be a layer of PSG, an SOG layer, a silicon oxynitride layer, or a combination thereof.

Figure 8:
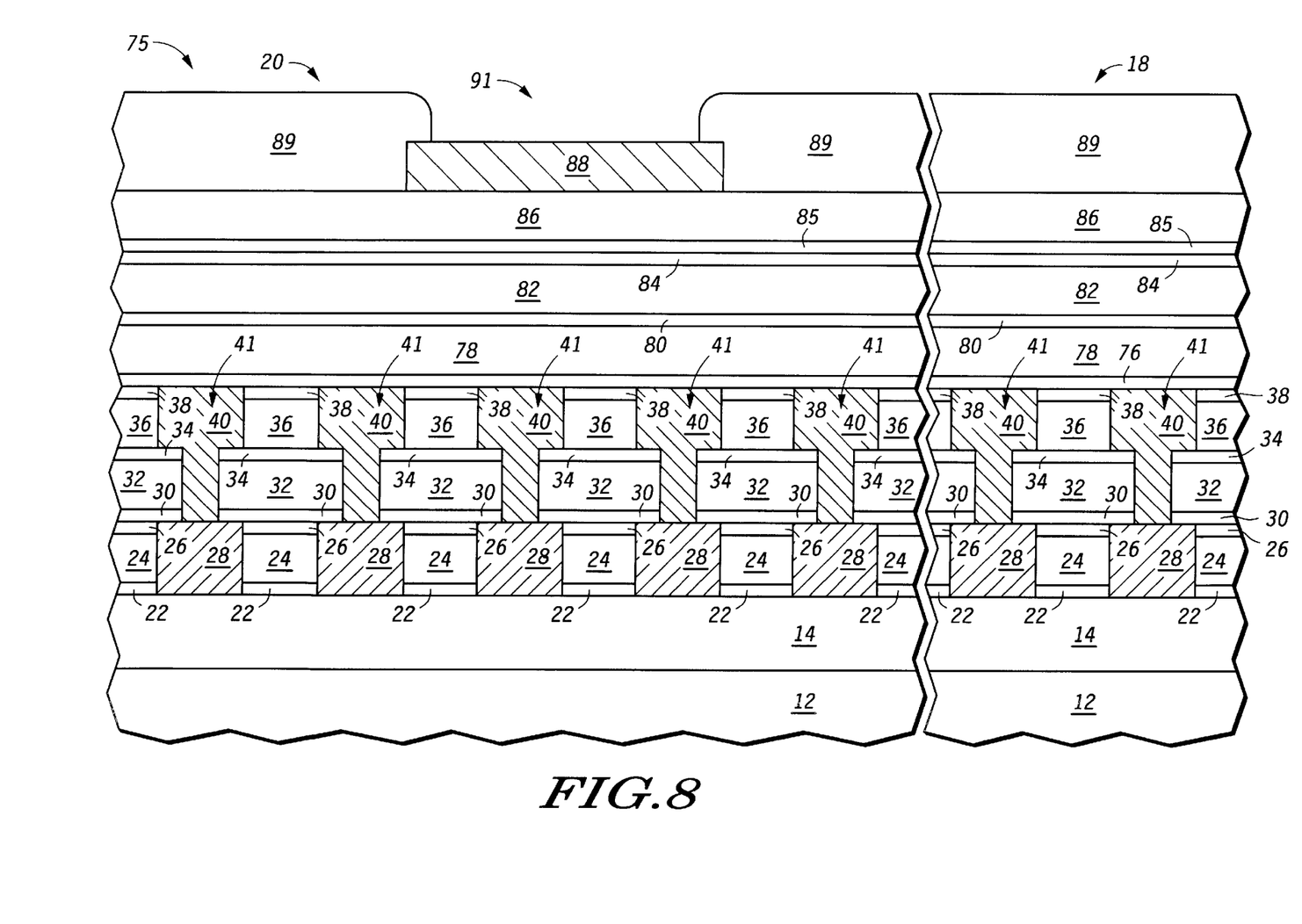
FIG. 8 illustrates, in cross-section, process steps in accordance with an alternative embodiment of the present invention.

Shown in FIG. 8 is a portion 75 of an integrated circuit structure in accordance with an alternative embodiment of the present invention. In FIG. 8, conductive support structures 41 comprise conductive members 40 and conductive members 28 of FIG. 5. After the integrated circuit structure of FIG. 5 is formed, a passivation layer 76 is formed overlying conductive support structures 41. A dielectric layer 78 is then formed overlying passivation layer 76. An etch stop layer 80 is then formed overlying the dielectric layer 78. A dielectric layer 82 is formed overlying etch stop layer 80 and a polish stop layer 84 is formed overlying dielectric layer 82.

In one embodiment, passivation layer 76 is a layer of silicon oxynitride which is formed using conventional plasma deposition techniques. Alternatively, passivation layer 76 may be a layer of plasma deposited silicon nitride, a boron nitride layer, or the like. Dielectric layer 78 is formed using a material having a high modulus of elasticity (Young's modulus). In one embodiment, dielectric layer 78 is a layer of plasma deposited oxide which is formed using tetraethoxysilane (TEOS) as a source gas and has a modulus of elasticity greater than approximately 50 GPa. Alternatively, dielectric layer 78 may be a layer of silicon nitride, a layer of phosphosilicate glass (PSG), a layer of borophosphosilicate glass (BPSG), a silicon oxynitride layer, a layer of fluorinated plasma oxide, or a combination thereof.

In one embodiment, etch stop layer 80 is a layer of silicon oxynitride. Alternatively, etch stop layer 80 may be a layer of plasma deposited silicon nitride, a boron nitride layer, an SOG material, or the like. Dielectric layer 82 is formed using a material having a high modulus of elasticity (Young's modulus). In one embodiment, dielectric layer 82 is a layer of plasma deposited oxide which is formed using tetraethoxysilane (TEOS) as a source gas and has a modulus of elasticity greater than approximately 50 GPa. Alternatively, dielectric layer 82 may be a layer of silicon nitride, a layer of phosphosilicate glass (PSG), a layer of borophosphosilicate glass (BPSG), a silicon oxynitride layer, a layer of fluorinated plasma oxide, or a combination thereof.

In one embodiment, polish stop layer 84 is a layer of silicon oxynitride. Alternatively, polish stop layer 84 may be a layer of plasma deposited silicon nitride, a boron nitride layer, or the like.

A passivation layer 85 is then formed overlying polish stop layer 84, and a dielectric layer 86 is formed overlying passivation layer 85. In one embodiment, passivation layer 85 is a layer of silicon oxynitride which is formed using conventional plasma deposition techniques. Alternatively, passivation layer 85 may be a layer of plasma deposited silicon nitride, a boron nitride layer, or the like. In one embodiment, dielectric layer 86 is a layer of plasma deposited oxide which is formed using TEOS as a source gas. Alternatively, dielectric layer 86 may be a layer of silicon nitride, a layer of PSG, a layer of BPSG, an SOG layer, a silicon oxynitride layer, or a combination thereof. A conductive bonding pad 88 is then formed overlying dielectric layer 86. Conductive bonding pad 88 is electrically connected to semiconductor devices (not shown) that lie within the device region of the integrated circuit. In one embodiment, conductive bonding pad 88 is formed by depositing a conductive layer comprising aluminum, such as aluminum, aluminum-silicon, aluminum-copper, aluminum-silicon-copper, or the like, and then patterning the conductive layer using conventional etching techniques. Alternatively, conductive bond pad 88 may be formed using other conductive materials, such as copper, tungsten, titanium, or the like. A passivation layer 89 is formed overlying dielectric layer 86 and conductive bonding pad 88, and then patterned form a bond pad opening 91. In one embodiment, passivation layer 89 is a layer of plasma deposited silicon nitride. Alternatively, passivation layer 89 may be a layer of PSG, an SOG layer, a silicon oxynitride layer, or a combination thereof.

It should be appreciated that in this embodiment of the invention, constructive support structures 41 need not extend through dielectric layer 78 and dielectric layer 82 because they are not formed using a material which has a low Young's modulus. Thus, these dielectric layers need not be supported or stabilized during subsequent processing. In addition, it should also be appreciated that the present invention allows dielectric layers with both low and high Young's modulus'to be used to fabricate integrated circuit structures, such as that shown in FIG. 8. Specifically, the present invention allows one or more dielectric layers having a low Young's modulus to be placed between two other dielectric layers that have a high Young's modulus. For example, in FIG. 8 dielectric layer 36, dielectric layer 32 and dielectric layer 24 which have a low Young's modulus have been placed between dielectric layer 14 and dielectric layer 82 have a high Young's modulus.

Figure 9:
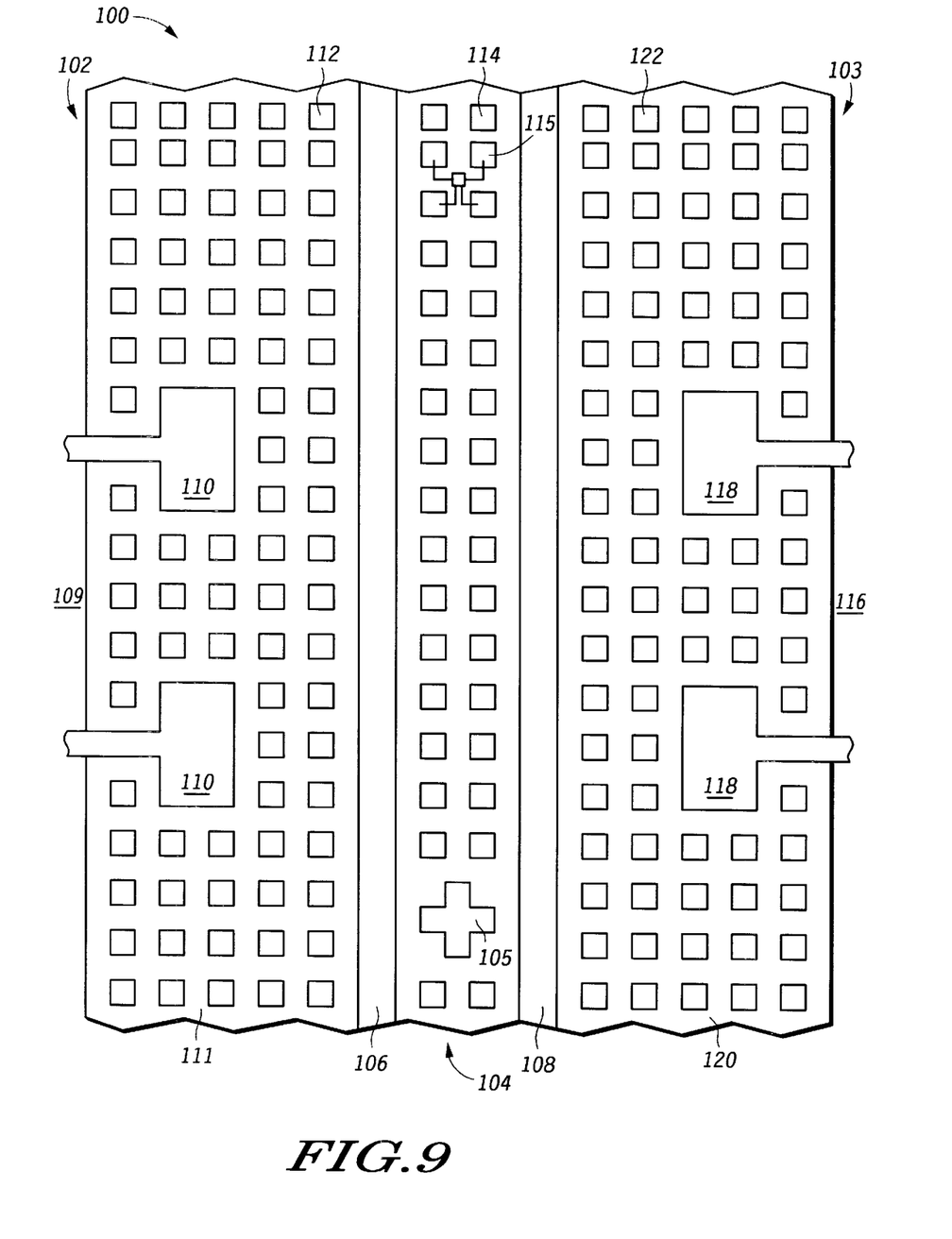
FIG. 9 illustrates, in top-down view, a portion of an integrated circuit in accordance with one embodiment of the present invention.

Shown in FIG. 9 is a top down view of a portion 100 of an integrated circuit structure in accordance with one embodiment of the present invention. The integrated circuit structure 100 comprises a first integrated circuit die 102, a second integrated circuit die 103, and a scribe line region 104. The scribe line region 104 lies between the first integrated circuit die 102 and the second integrated circuit die 103, and comprises conductive support structures 114, an alignment key 105, and a test structure 115. The first integrated circuit die 102 comprises an edge seal region 106, a device region 109, conductive bond pads 110, a bond pad region 111, and conductive support structures 112. The second integrated circuit die 103 comprises an edge seal region 108, a device region 116, conductive bond pads 118, a bond pad region 120, and conductive support structures 122. As shown in FIG. 9, conductive support structures 112 lie within bond pad region 111. Conductive support structures 112 lie outside the perimeter of conductive bond pads 110, and lie between conductive bond pads 110 and edge seal region 106. In addition, conductive support structures 112 lie between device region 109 and conductive bond pads 110. Similarly, on second integrated circuit die 103, conductive support structures 122 lie within bond pad region 120. Conductive support structures 122 lie outside the perimeter of conductive bond pads 118, and lie between conductive bond pads 118 and edge seal region 108. In addition, conductive support structures 122 lie between device region 116 and conductive bond pads 118.

Thus it is apparent that there has been provided, in accordance with the present invention, an integrated circuit structure and method that allows semiconductor devices to be reliability fabricated using low-k dielectric materials. Although the invention has been described and illustrated with reference to specific embodiments, it is not intended that the invention be limited to these illustrative embodiments. Those skilled in the art will recognize that modifications and variations may be made without departing from the spirit and scope of the invention. For example, the conductive support structures of the present invention may be formed using only single inlaid metal processing, instead of using a combination of dual inlaid and single inlaid metal processing, as is shown in FIG. 7 and FIG. 8. Therefore, it is intended that this invention encompass all variations and modifications as fall within the scope of the appended claims.

What is claimed is:

1. A method for forming an integrated circuit comprising:
    forming a dielectric layer over a substrate, the dielectric layer having a Young's modulus of approximately less than 15.0 Giga Pascals;
    forming an opening in the dielectric layer;
    forming a conductive layer within the opening; and
    polishing the conductive layer to form a conductive support structure that extends through the dielectric layer and is electrically insulated from both functional circuit elements and testable circuit elements associated with the integrated circuit.

2. The method of claim 1, wherein the dielectric layer is further characterized as having a dielectric constant of less than approximately 3.6.

3. The method of claim 1, wherein the dielectric layer comprises a material selected from a group consisting of xerogel, aerogel, polyimide, parylene, biscyclobutenes, fluorocarbons, polyarylether-based materials, spin on glass, polysiloxanes, silsesquioxanes, and carbon-containing silicon oxide.

4. The method of claim 1, wherein the conductive layer comprises a material selected from the group consisting of tungsten, titanium, tantalum, copper, and aluminum.

5. The method of claim 1 wherein polishing the conductive layer to form a conductive support structure is further characterized as polishing the conductive layer to form a conductive support structure within a scribe line region.

6. The method of claim 1, wherein polishing the conductive layer to form a conductive support structure is further characterized as polishing the conductive layer to form a conductive support structure within an integrated circuit die.

7. The method of claim 6, wherein polishing the conductive layer to form a conductive support structure is further characterized as polishing the conductive layer to form a conductive support structure that underlies a bond pad.

8. A method for forming an integrated circuit comprising:
    providing a semiconductor substrate, the semiconductor substrate having a device region and a bond pad region;
    forming a first dielectric layer overlying the bond pad region;
    forming a first conductive bond pad overlying the bond pad region and overlying the first dielectric layer, the first conductive bond pad having a perimeter; and
    forming a first plurality of conductive support structures overlying the bond pad region and extending through the first dielectric layer, wherein the first plurality of conductive support structures lie outside the perimeter of the first conductive bond pad and are electrically insulated from the first conductive bond pad and any functional circuit elements and testable circuit elements associated with the integrated circuit.

9. The method of claim 8, wherein the first dielectric layer has a dielectric constant of less than approximately 3.6.

10. The method of claim 8, wherein the first dielectric layer has a Young's modulus of less than approximately 15.0 Giga Pascals.

11. The method of claim 8, wherein the first dielectric layer includes xerogel.

12. The method of claim 8, wherein the first dielectric layer comprises a material selected from a group consisting of aerogel, polyimide, parylene, biscyclobutenes, fluorocarbons, polyarylether-based materials, spin on glass, polysiloxanes, silsesquioxanes, and carbon-containing silicon oxide.

13. The method of claim 8, wherein the first plurality of conductive support structures comprise a material selected from the group consisting of tungsten, copper, and aluminum.

14. The method of claim 8, further comprising forming a second plurality of conductive support structures, wherein the second plurality of conductive support structures extend through the first dielectric layer and lie within a scribe line region.

15. A method for forming an integrated circuit comprising:
    forming a first dielectric layer overlying a semiconductor substrate, wherein the first dielectric layer includes a material having a dielectric constant less than approximately 3.6, and wherein the semiconductor substrate includes an integrated circuit die region; and
    forming a conductive support structure, wherein the conductive support structure extends through the first dielectric layer, and wherein the conductive support structure is electrically insulated from circuit elements associated with the integrated circuit die region.

16. The method of claim 15, wherein forming the conductive support structure is further characterized as forming the conductive support structure within the integrated circuit die region.

17. The method of claim 15, wherein the semiconductor substrate further comprises a scribe line region, wherein the scribe line region is apart from the integrated circuit die region and wherein forming the conductive support structure is further characterized as forming the conductive support structure within the scribe line region.

18. The method of claim 15, wherein the first dielectric layer includes a material having a Young's modulus of less than approximately 15.0 Giga Pascals.

19. The method of claim 15, wherein the integrated circuit die region further comprises a bond pad, and wherein forming the conductive support structure is further characterized as forming the conductive support structure such that it underlies the bond pad.

20. The method of claim 15, further comprising:
    forming a feature having a Young's modulus that is greater than approximately 15.0 Giga Pascals prior to forming the first dielectric layer, wherein the conductive support structure overlies the feature.

* * * * *